United States Patent [19]

Wei

[11] Patent Number: 5,239,298

[45] Date of Patent: Aug. 24, 1993

[54] DATA COMPRESSION

[75] Inventor: Victor K. Wei, Morristown, N.J.

[73] Assignee: Bell Communications Research, Inc., Livingston, N.J.

[21] Appl. No.: 870,583

[22] Filed: Apr. 17, 1992

[51] Int. Cl.[5] .......................................... H03M 7/30
[52] U.S. Cl. .......................................... 341/51; 341/87
[58] Field of Search ................... 341/51, 65, 95, 67, 341/87; 364/222.81, 248.1, 256.3, 259.9, 260.4, 282.1, 283.2; 395/600

[56] References Cited

U.S. PATENT DOCUMENTS

| | | | |
|---|---|---|---|
| 4,464,650 | 7/1984 | Eastman et al. | 341/51 |
| 4,558,302 | 12/1985 | Welch | 340/347 |
| 4,796,003 | 1/1989 | Bentley et al. | 341/95 |
| 4,906,991 | 3/1990 | Fiala et al. | 341/51 |
| 5,087,913 | 2/1992 | Eastman | 341/95 |

OTHER PUBLICATIONS

"A Technique for High Performance Data Compression", Terry A. Welch, 1984 IIII, pp. 8–19.
"A Locally Adaptive Data Compression Scheme", Bentley-Sleator-Tarjan-Wei, Communications of the ACM, Apr. 1986, vol. 29, No. 4, pp. 320–330.

Primary Examiner—A. D. Pellinen
Assistant Examiner—Brian K. Young
Attorney, Agent, or Firm—Leonard Charles Suchyta; John T. Peoples

[57] ABSTRACT

Methodology and concomitant circuitry for compacting an incoming data stream into an outgoing compacted data stream utilize a multiple, doubly-linked list and an associated class promotion data structure. The incoming data stream is partitioned into a sequence of symbols. A memory associated with the data structure stores each symbol, information regarding the recency rank of each symbol as it arrives in sequence as well as class information and pointer information for each symbol. For each symbol, the memory is checked to determine if the symbol is new or repeated. If the symbol is repeated, only the recency rank is used to form that part of the outgoing data stream associated with the new symbol. If the symbol is new, identification information is added to the symbol and both the identification information are emitted as part of the compacted stream. Memory update operations are then effected to change class, recency rank and pointer information. The decoding methodology and circuitry performs the inverse to the compacting operations using the class promotion data structure.

12 Claims, 10 Drawing Sheets

FIG. 12

| | | | | | | | | |
|---|---|---|---|---|---|---|---|---|
| | | ⋮ | | | | 1 | 111 | 111 | 151 |
| 111 | AL | 151 | 151 | 1 | 1 | 2 | 129 | 115 | 152 |
| | | ⋮ | | | | 4 | 122 | 147 | 153 |
| | | | | | | | | | 154 |
| 115 | BETH | 129 | 152 | 2 | 3 | | ⋮ | | |
| | | ⋮ | | | | | | | |
| 122 | ED | 153 | 124 | 3 | 4 | | | | |
| | | ⋮ | | | | | | | |
| 124 | CARL | 122 | 142 | 3 | 5 | | | | |
| | | ⋮ | | | | | | | |
| 129 | FRAN | 152 | 115 | 2 | 2 | | | | |
| | | ⋮ | | | | | | | |
| 142 | DEE | 124 | 147 | 3 | 6 | | | | |
| | | ⋮ | | | | | | | |
| 147 | GREG | 142 | 153 | 3 | 7 | | | | |
| | | ⋮ | | | | | | | |

100: 101, 102
150

| SOURCE SYMBOL | POINTER UP | POINTER DOWN | CLASS | REGENCY RANK |
|---|---|---|---|---|

103

| # OF SOURCE SYMBOLS | POINTER UP | POINTER DOWN |
|---|---|---|

155

DATA COMPRESSION

FIELD OF THE INVENTION

This invention relates generally to digital systems and, more specifically, to data compaction signal processing circuitry and concomitant methodology for encoding and decoding data streams.

BACKGROUND OF THE INVENTION

The rapidly growing use of computer-based information systems interconnected with communication networks has dramatically increased the use of digital storage and digital transmission systems. Data compression is concerned with the compaction of data before storage or transmission. Such compaction is useful for conserving memory or communication resources. When the data source can be modeled by a statistical system, optimal coding schemes have been constructed to achieve desired compaction criteria. However, for real-world data, the source statistics are not always known to the data compressor. In fact, real-world data usually does not conform to any statistical model. Therefore it is important in most practical data compaction techniques to have an adaptive arrangement which can compress the data without knowing the statistics of the data source.

Much stored or transmitted data is redundant. The English language, for example, or a programming language, includes "words" which are often reused. One type of coding which takes advantage of this redundancy is the well-known Huffman code. In the Huffman scheme, variable length code words are used, with the length of the code word being related to the frequency of occurrence of the encoded symbol. Unfortunately, the Huffman approach requires two passes over the data, one to establish the frequency of occurrence of the symbols and another to do the actual encoding. Moreover, the Huffman technique requires temporary storage from the entire data block while the first pass is taken, thereby incurring a corresponding time delay.

In June, 1984, Welch published a paper entitled "A Technique for High-Performance Data Compression" in the *IEEE Computer Magazine*. The paper treated an algorithm, which has become known as the Lempe-Ziv algorithm, in a practical way, and proposed an implementation for data compression based on hashing for fast on-line processing. U.S. Pat. No. 4,558,302, having Welch as the sole inventor, covers the details of the implementation first introduced in theoretical form in his paper. More recently, U.S. Pat. No. 4,906,991, issued to Fiala and Greene, disclosed a sophisticated modification to the Lempe-Ziv algorithm which achieves better compression on most text files—but at the cost of significantly increased complexity.

In April, 1986, Bentley, Sleator, Tarjan and Wei published a paper entitled "A Locally Adaptive Data Compression Scheme" in the *Communications of the ACM*. In the paper, the authors proposed the use of a self-adjusting data structure to achieve data compression of text data. One of their main schemes used a "move-to-front" rule; this concept will be expanded upon below.

More recently, the disclosure of U.S. Pat. No. 4,796,003, issued to Bentley, Sleator and Tarjan (Bentley et al), indicates that it is possible to compress data with a compaction factor comparable to Huffman coding, but with a one pass procedure. More particularly, a system and an algorithm are used in which a word list is maintained with the position of each word on the word list being encoded in a variable length code, the shortest code representing the beginning of the list. When a word is to be transmitted in communication applications (or stored in memory applications), the list or codebook is scanned for the word. If the word is on the list, the variable length code representing the position of the word on the list is sent (or stored) instead of the word itself and the word is moved to the head of the word list. If the word is not on the word list, the word itself is transmitted (or stored), and then that word is moved to the head of the word list while all other words on the word list are "pushed down" while maintaining their relative order.

The receiver (or retriever in memory storage applications) decodes the data by repeating the same actions performed by the transmitter (or the storing mechanism). That is, a word list is constructed and the variable length codes are used to recover the proper words from the word list.

In the scheme of Bentley et al, the most often used words will automatically congregate near the front of the word list and hence be transmitted or stored with the smallest number of bits. Moreover, arbitrary prefixed codes can be used to transmit or store word positions on the list, low positions being encoded with the shortest codewords. Also, the list organization heuristics can be varied such as, for example, by moving the selected word ahead a fixed number of places or transposing it one position forward. Finally, the list positions themselves can be treated as new input data and the compaction scheme applied recursively to its own output, creating a new list and new variable length codes.

As alluded to, the encoder of the move-to-front implementation of Bentley et al has two operations, namely, (1) Search: for each input word, search for it in the codebook; and (2) Update: reorganize the codebook for further use. The implementation of Bentley et al organizes the codebook as a linear list. Both the search and update operations are done in linear fashion, i.e., they use linear search and linear update algorithms. The time complexity of each operation is in proportion to the codebook size, which is typically in the thousands to the tens of thousands. Thus, the complexity is high. In the earlier paper by Bentley, Sleator, Tarjan, and Wei, the codebook is organized as a doubly-linked double tree. The trees are adjusted after each input word to maintain depth balance. Thus either the search or the update operation can be accomplished in complexity proportional to the logarithm of the codebook size. But the complicated data structure results in extremely large memory requirements, and the coefficient of the logarithmic complexity can also be large. Thus, the complexity of this latter scheme may not even be less than the linear approach for codebook sizes of practical interest.

A decoder in accordance with the present invention compiles a word list from the encoded data and performs the inverse of the encoding methodology.

SUMMARY OF THE INVENTION

These shortcomings as well as other limitations and deficiencies are obviated in accordance with the present invention by a methodology and concomitant circuitry wherein only a small, constant number of steps is required to process each source symbol. This processing effects a method and concomitant implementation which are extremely fast.

Broadly, with the improvement over the prior art engendered by the inventive subject matter, the codebook is organized as a collection of varying-size doubly-linked lists, designated the multiple-doubly-linked (MDL) lists. For a codebook size of $2^m-1$, there is a single list which is subdivided into sublists of size $2^0=1$, $2^1=2, 2^3=8, \ldots, 2^{(m-1)}$. For the Search operation, an associative memory is searched to determine if each incoming symbol is present or absent in the codebook. The associative memory is a memory arrangement which is accessed by symbol, rather than address. In a hardware implementation, the associative memory is realized by a Content Addressable Memory (CAM), whereas in a software realization the associative memory is effected via a hashing function operation. If a symbol is present, recency rank information about the symbol is converted to a data stream for propagation on the communication medium. In addition, the recency rank of the symbol is changed to reflect its recent appearance. The recency rank is changed by merely altering entries in the MDL list. In one illustrative embodiment, these alterations are effected using a class promotion technique wherein the given symbol, when present, is generally moved to the top-most position in the next highest class. The symbol previously occupying this top-most position is moved, for instance, to the bottom of the class previously occupied by the given symbol. In another illustrative embodiment, the symbol is moved half-way to the top of the class list and the symbol occupying that half-way location is moved to the location vacated by the symbol. If a symbol is not present, then the symbol is stored in an empty location in the associative memory or, if the associative memory is full, an overwrite of an occupied location occurs. The time complexity in the Search is just one step, namely, just one read for a hardware CAM, or one hash for the software version of the associative memory. The Update operation for each illustrative embodiment involves merely updating a constant number of pointer operations on the MDL.

The organization and operation of this invention will be understood from a consideration of the detailed description of the illustrative embodiment, which follows, when taken in conjunction with the accompanying drawing.

BRIEF DESCRIPTION OF THE DRAWING

FIGS. 11 and 12, which are the counterparts to FIGS. 2 and 3, depict memory layout and data structure for a new input symbol;

DETAILED DESCRIPTION

By way of introducing terminology and notation useful in elucidating the present invention, an overview description of representative prior art is first presented; following this overview, an illustrative embodiment in accordance with the present invention is described.

Prior Art

Figure 1:
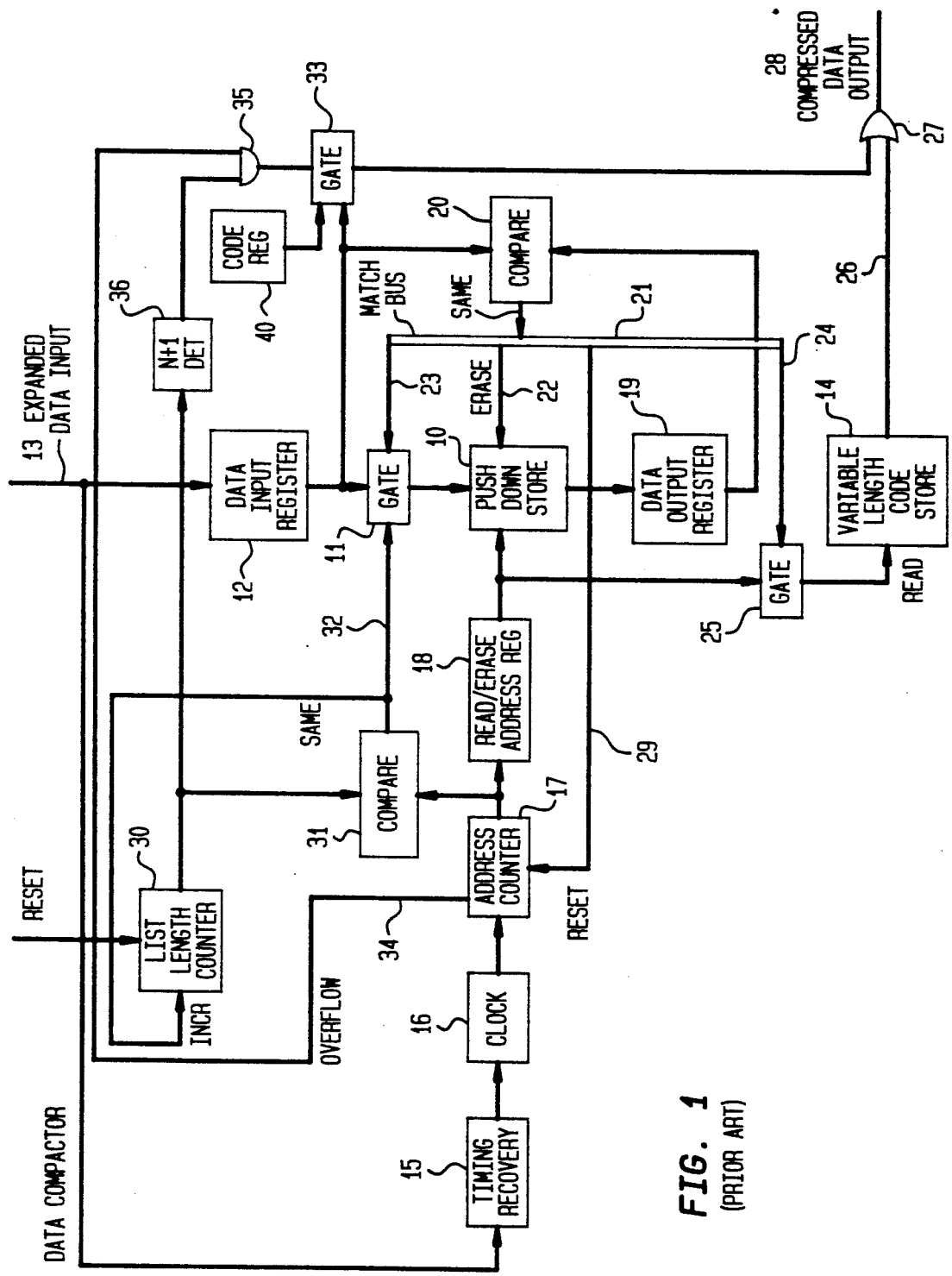
FIG. 1 is a prior art block diagram for the encoder of Bentley et al.

A locally adaptive data compression system, such as disclosed by Bentley et al (U.S. Pat. No. 4,796,003), is considered as representative of recent prior art compression schemes and is presently discussed. The system under consideration is a communication system wherein an incoming data stream is encoded by a transmitter, the encoded stream is propagated over a communication medium to a receiver, and the receiver decodes the propagating data stream. The block diagram of FIG. 1 depicts the prior art arrangement of Bentley et al. The principles conveyed by the description of this system may be applied to other systems, such as a data storage system.

When a given "word" arriving at expanded data input 13 of FIG. 1—for purposes of this initial discussion, the term "word" is used to define a grouping of alphanumeric characters from the incoming data stream—is to be encoded for transmission, a word list (push down store 10) maintained in the system is scanned for the appearance of the given "word". If it is present, a code associated with the "word" is used in place of, say, the ASCII representation of the "word" itself. The position of each "word" in the word list is indicative of the time of appearance of the "word" in the data stream; thus a recently appearing "word" is higher in the word list than a "word" that appeared some time ago. The position of the "word" in the word list is encoded in a variable length code and stored in variable length code store 14, with the shortest code representing the top of the list, that is, "words" that appeared most recently. Then, rather than transmitting ASCII bits for the symbols comprising the "word" itself, the position of the "word" on the list if actually transmitted. Since such a positional code generally requires fewer bits than the ASCII representation for the "word" itself, the system provides efficient transmission of data. If the "word" is not in the list, then it is added to the list and the ASCII representation of each symbol in the "word" is transmitted as compressed data through output 28.

The original data is recovered in the receiver by compiling a word list from the encoded data stream and performing the inverse to the encoding operation.

In order to derive maximal advantage from a data compaction scheme, the incoming digital data stream must be partitioned into "data groups" (referred to above as "words") which approach maximum redundancy. In English text, for example, the space between actual English words ("white space")can be used to divide the data stream into "data groups" which are highly redundant. Computer programs can be similarly partitioned into "data groups" using punctuation and white space as natural separators. The process of partitioning the data stream into "data groups" is called lexical analysis and the resulting "data groups" are called source symbols. Such processed are well-known and are found universally in computer program compilers and assemblers, as well as in most word processing packages. Some data streams, such as encoded voice, are already divided into highly redundant data bits and need no further lexical analysis. By way of notation, the phrase word list is now referred to more specifically by the term dictionary—the dictionary stores source symbols—in the discussion of the representative prior art.

To give a particular example of how the encoding process works, the following stream of source symbols obtained by lexical analysis is to be processed at the transmitter:
that that is is that that is not is not is not that it it is
(such a stream is not contrived; it arises from the following sentence:
"that that is, is; that that is not, is not; is not that is? it is!"

wherein the stream of symbols is derived by merely removing the punctuation; punctuation can be treated separately)

The first symbol is "that"; since the dictionary is initially empty, no symbols appear in the dictionary. Thus, the symbol "that" is added to the dictionary. Then a series of bits subdivided into three segments is transmitted over the communication path to the receiver of the system; the three segments are composed of: (1) a code for a delimiter symbol; (2) a fixed number of bits (eight in this example) which specify the number of letters in the word (four in this case), so the bit stream is 00000100; and (3) the extended ASCII code or the 8-bit code for the letters comprising the symbol "that". (The Bentley patent does not teach or suggest the inclusion of item (2), namely, the fixed length word between the delimiter and the ASCII code, but such an indicator is needed in practice so as to partition and thereby decode the bits representative of the new symbol.) The delimiter symbol is first transmitted to indicate that a new source symbol follows. The delimiter symbol is unique and can be decoded accordingly; the procedure for determining the delimiter symbol is discussed shortly. For specificity, for one illustrative code (generation of the illustrative code is also discussed shortly), the delimiter symbol has the bit representation 01101. The extended ASCII string for "that" is 01110100011010000110000101110100.

The next source symbol to be processed is again a "that". The dictionary is checked for this symbol, and since it appears at the top of the dictionary or as the highest entry, the variable length code for this specific "that" is transmitted. For the illustrative code, a single 1 bit is transmitted.

The next source symbol processed is "is". The dictionary is checked for this symbol, and since it is not in the dictionary, it is added to the top of the dictionary and the "that" symbol is pushed down to the second entry. Now the "is" symbol is associated with the single 1 bit code, and the "that" symbol has a code of 0100 indicative of the second position in the dictionary. The delimiter symbol is transmitted, followed by the byte 00000010 (there are two letters to follow), then followed by the ASCII bit string for "is", namely, 0110100101110011.

The next source symbol processed is "is". The dictionary is checked for this symbol, and since it is now in the dictionary as the top entry, a single 1 bit is transmitted. The dictionary entries remain the same, namely "is" is associated with the 1 code, and "that" is associated with the 0100 code.

The next source symbol processed is "that". The dictionary is checked for this symbol, and since it is now in the dictionary as the second most recent entry, the code 0100 is transmitted. Moreover, "that" now replaces "it" as the most recent entry, and "it" is pushed down in the dictionary. Accordingly, "that" is now associated with the 1 code, and "is" with 0100.

The processing continues serially in this manner across the source symbols; the table below summarizes the results of the encoding wherein the first entry in the dictionary has the variable length code 1, the second entry has the code 0100, the third entry has the code 0101, and the fourth entry has the code 01100.

TABLE I

| TIME | WORD | BINARY SIGNAL |
|---|---|---|
| 1 | (delimiter) | 01101 |
| 2 | (length) | 00000100 |
| 3 | that | 01110100011010000110000101110100 |
| 4 | that | 1 |
| 5 | (delimiter) | 01101 |
| 6 | (length) | 00000010 |
| 7 | is | 0110100101110011 |
| 8 | is | 1 |
| 9 | that | 0100 |
| 10 | that | 1 |
| 11 | is | 0100 |
| 12 | (delimiter) | 01101 |
| 13 | (length) | 00000011 |
| 14 | not | 011011100110111101110100 |
| 15 | is | 0100 |
| 16 | not | 0100 |
| 17 | is | 0100 |
| 18 | not | 0100 |
| 19 | that | 0101 |
| 20 | (delimiter) | 01101 |
| 21 | (length) | 00000010 |
| 22 | it | 0110100101110100 |
| 23 | it | 1 |
| 24 | is | 01100 |

As alluded to in the above discussion, the position of each source symbol in the dictionary has an associated code of variable length. One illustrative code is the Elias representation of an integer. The Elias representation encodes positive integers by variable length binary strings. The version selected for the illustrative code encodes the integer i with $\lfloor 1+\log_2 i + 2\log_2(1+\log_2 i) \rfloor$ bits, where $\lfloor \ \rfloor$ is the "round down to an integer" notation. The representation of i is composed of three segments. There are two steps to generate the code representation: (1) the third segment is the binary expansion of the integer i, the second segment is the binary expansion of the length of the third segment; the first segment is as long as the second and it is composed of all zeros except the last bit; and (2) the first bit of the second segment and the first bit of the third segment are dropped because they are always a 1 bit. The encoding of the integers 1 through 8 are shown in Table II. As applied to data compression, the integers represent the appearance of the source symbols in the dictionary. Thus the most recent symbol is associated with a 1 bit, the next most recent symbol is associated with the string 0100, the third most recent symbol is associated with the string 0101, and so forth.

TABLE II

| i | First Seg. | Second Seg. | Third Seg. |
|---|---|---|---|
| 1 | 1 | (1) | (1) |
| 2 | 01 | (1)0 | (1)0 |
| 3 | 01 | (1)0 | (1)1 |
| 4 | 01 | (1)1 | (1)00 |
| 5 | 01 | (1)1 | (1)01 |
| 6 | 01 | (1)1 | (1)10 |
| 7 | 01 | (1)1 | (1)11 |
| 8 | 001 | (1)00 | (1)000 |

In the example above, the delimiter was given by the string 01101, which is the Elias representation for the integer 5. In the example, it was presumed that the dictionary was of length four so as to accommodate the four source symbols "that", "it", "is", and "not". The delimiter is determined by the size of the dictionary; if the dictionary stores D symbols, then the delimiter is the Elias representation of the integer (D+1).

Decoding of an Elias integer is accomplished by counting from the left until encountering the bit 1 to obtain the length of the second segment. Then the second segment is read to obtain the length of the third segment. The third segment is the binary expansion of the integer i. The leading bit of the second segment and the leading bit of the third segment are restored.

As suggested by the above overview discussion of Bentley et al, the process of compacting data at the transmitter comprises the steps of: (1) searching the dictionary for each incoming source symbol; (2) updating the dictionary by adding/deleting/rearranging source symbols in the dictionary; and (3) transmitting the appropriate code for the each incoming source symbol. Both the search and updating are effected in linear fashion, that is, the dictionary is a linear list. Accordingly, the searching and updating algorithms result in a time complexity which is proportional to the size of the dictionary. For large dictionaries numbering in the thousands to tens of thousands of entries, the time to complete steps (1) and (2) are inordinately large, and therefore the implementation is not practical in a number of important, high-speed applications.

Present Invention

To gain insight into the basic methodology of the present invention, as illustrative example of the Search and Update operations is first presented. (The example uses only a small number of source symbols to reduce complexity of description without losing generality). This example commences with a snapshot of a data dictionary which already contains source symbol entries; corresponding to this snapshot in a conceptual model of a data structure which facilitates understanding of the Update operation.

Figure 2:
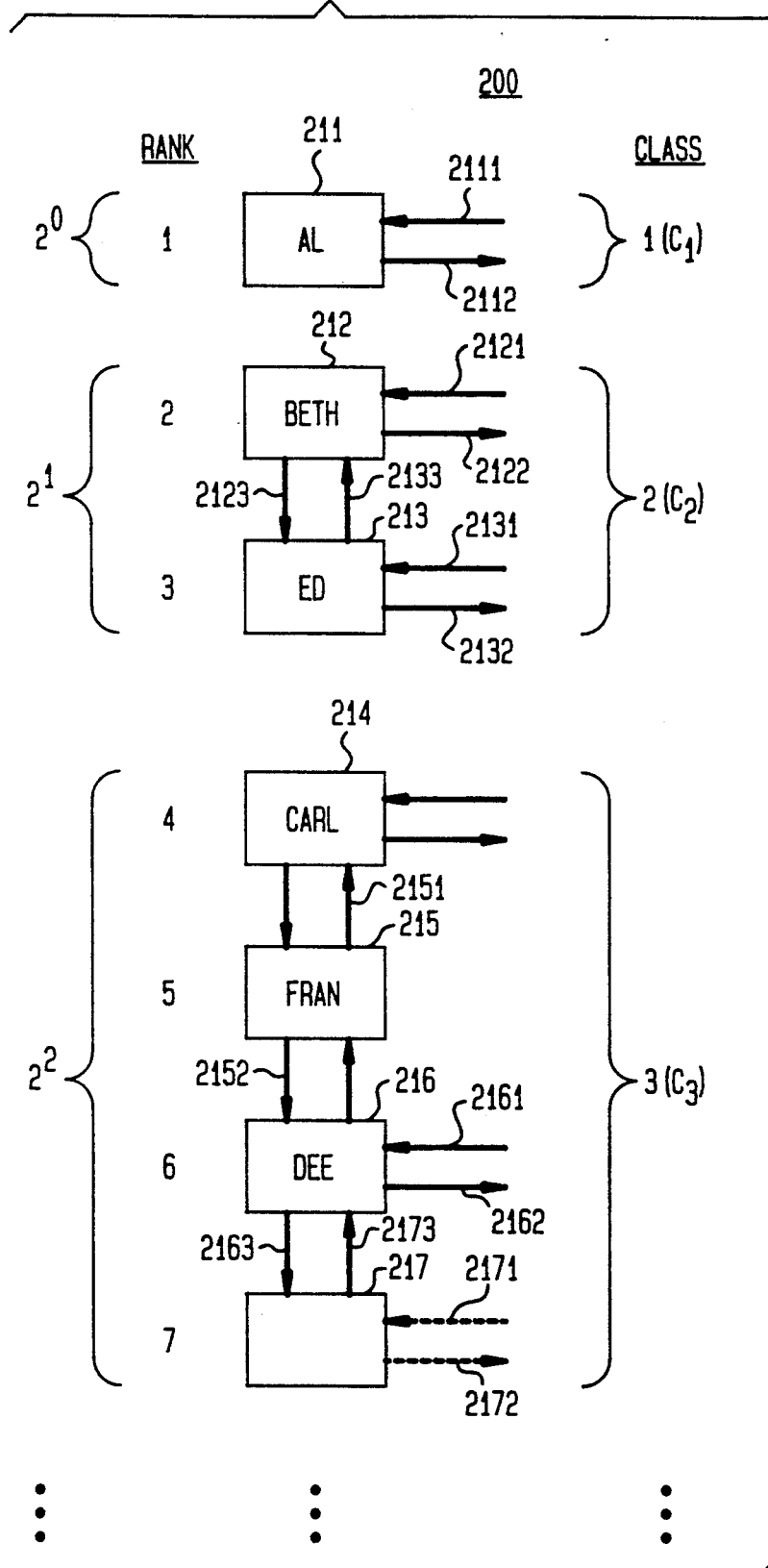
FIG. 2 is a depiction of an exemplary data structure showing partitioning of classes and illustrative members associated with each class.

The depiction of FIG. 2 is a layout of conceptual data structure 200 at a given instant for an exemplary dictionary. The source symbols are (in alphabetical order): "al, beth, carl, dee, ed, fran". These source symbols are shown as contained in blocks 211, 212, 214, 216, 213, and 215, respectively. The blocks, as distinct from the contents, are permanently arranged according to rank, that is, uppermost block 211 is always of the highest recency rank "1", block 212 is always of the next highest recency rank "2", and so forth. This is not meant to imply, however, that the contents of the blocks are fixed; in fact, the contents of the blocks may be dynamically rearranged on an ongoing basis as each Update occurs. The recency rank determines the Elias integer propagated by the transmitter. Thus, for example, block 211 is associated with the Elias integer string 1; block 212 has the associated string 0100; and block 216 has string 01110. The respective rank of each block is shown adjacent to it on the left. Thus, the source symbol "al" now has the highest rank ("1"), whereas "dee" has the lowest rank ("6") of the six source symbols.

Block 211 is in class $C_1$, whereas blocks 212 and 213 are in class $C_2$, and blocks 214-217 are in class $C_3$. (These classes may also be designated classes 1, 2, and 3, respectively, as a shorthand notation). Class $C_1$ has $2^0 = 1$ members, class $C_2$ has $2^1 = 2$ members, class $C_3$ has $2^2 = 4$ members, and so forth. This is depicted on the left-hand side of FIG. 2.

Each block or each class has associated with it so-called "up" and "down" pointers. For instance, block 215 has "up" pointer 2151 and "down" pointer 2152. As another example, block 212 has "up" and "down" pointers 2122 and 2123, respectively. It is noted that block 212 also has an incoming pointer 2121—this is the "up" pointer associated with class $C_2$. The "down" pointer associated with $C_2$ is pointer 2131. The utility of each of the pointers will be elaborated upon below. Block 211 is a special case in that its "up" and "down" pointers coalesce into a single pointer 2112. Similarly, the pointers associated with class $C_1$ coalesce into pointer 2111.

Block 217 is shown as being empty, that is, it is not associated with any source symbol. In fact, the next source symbol that arrives which is not contained in the dictionary may be associated with block 217 (other associations are also possible, as discussed below). When this new symbol is introduced, pointers 2171-2173 must be activated; this description will also be given shortly.

Figure 3:
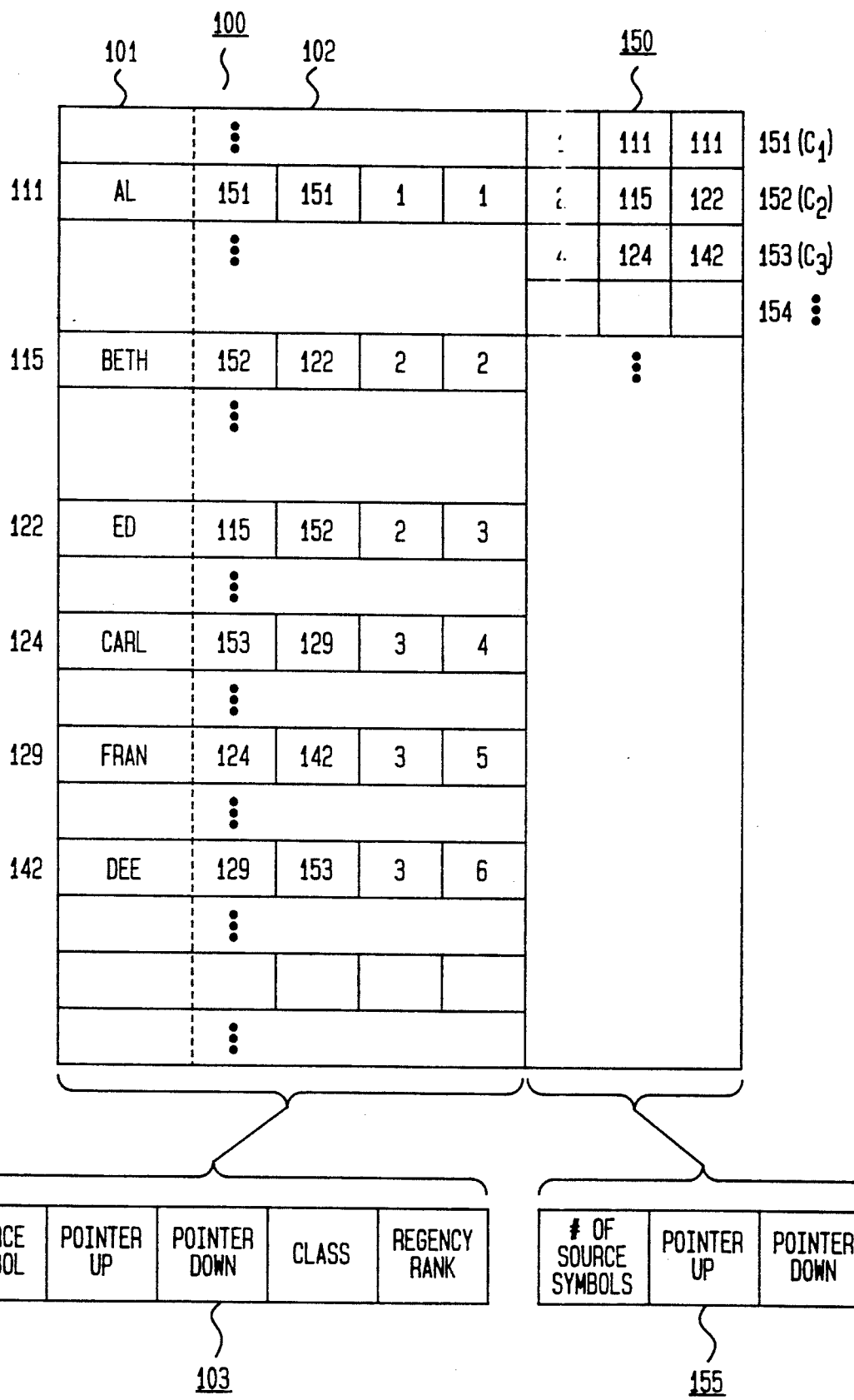
FIG. 3 is a depiction of a memory layout which is representative of a multiple-doubly-linked (MDL) list showing exemplary storage locations for storing the illustrative members and class information.

The depiction of FIG. 3 shows memory segments 100 and 150 which correspond to conceptual data structure 200 of FIG. 2 in the manner now set forth. Segment 100 has a plurality of memory locations or addresses; shown specifically are locations 111, 115, 122, 124, 129, and 142. At these locations are stored, respectively, the source symbols "al, beth, ed, carl, fran, dee." As further depicted by legend block 103 (at the bottom of FIG. 3), each location stores, in addition to its associated source symbol, four other pieces of information: (a) the memory location of the "up" pointer; (b) the memory location of the "down" pointer; (c) the class membership; and (d) the recency rank. As an example of the manner in which a memory location is filled-in with data, location 129 is taken as exemplary. With reference to data structure 200 of FIG. 2, it is readily discerned that "fran" has recency rank "5" and this source symbol is in class 3 ($C_3$). In addition, since "fran" points up to "carl", then the "up" pointer associated with "fran" , stores the memory location of "carl", that is, location '124'. Similarly, "fran" points down to "dee", so the "down" pointer of "fran" stores location '142'.

Segment 150 also encompasses a plurality of memory locations or addresses; shown specifically are locations 151-154. These locations store information pertinent to the classes. For instance, memory location 152 is associated with class $C_2$. As depicted by legend block 155 (at the bottom right of FIG. 3), each location in segment 150 stores: (a) the number of source symbols for the given class; (b) the memory location of the "up" pointer; and (c) the memory location of the "down" pointer. Again, with reference to FIG. 2, location 152 stores, correspondingly: 2(there are $2^1=2$ source symbols in class 2); '115' (the "up" pointer points to "beth", which is at memory location 115); and '122' (the "down" pointer points to "ed", which is at memory location 122). It will be recalled that block 211 and class 1 had a special relationship in that the "up" and "down" pointers for each coalesced. This is depicted by the contents of memory location 111 wherein the second and third entries both point to memory location 151—the location of class 1; also, memory location 151 has second and third entries which both point to memory location 111—the location of the dictionary entry "al" associated with block 211.

Figure 4:
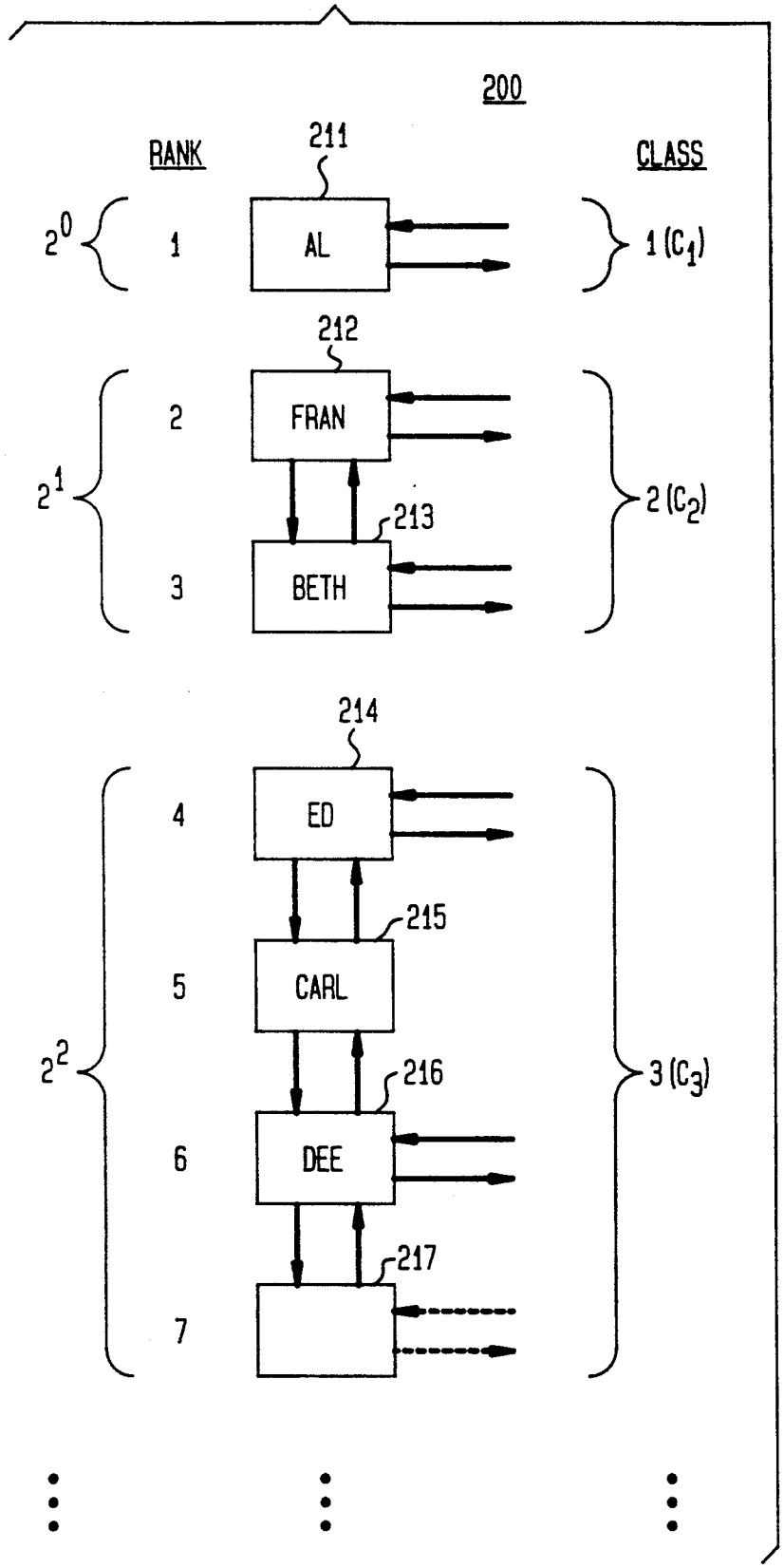
FIG. 4 is a depiction of an exemplary data structure showing partitioning of classes and illustrative members associated with each class after a next source symbol has arrived and has been processed.

To visualize how conceptual data structure 200 is changed when another symbol is received for processing, and how this processing changes the contents of memory segments 100 and 150, reference is made first to FIG. 4. It is assumed that the next symbol to be processed is the symbol "fran"; this symbol is already entered into the dictionary, that is, memory segment 150 at location 129. Accordingly, the Search portion of the processing yields the fact that the symbol "fran" is already in memory. Broadly (a more detailed description is given shortly), this is accomplished through the use of associative memory processing whereby the symbol "fran" is submitted for processing, and the memory location of "fran" is returned as an output, namely, location 129. Since the memory location for "fran" is known, then the Elias code associated with its recency rank (5, which corresponds to string 01101) is transmitted directly onto the transmission medium.

To Update the contents of segments 100 and 150, a technique referred to as class promotion is first described. (Other variations are possible, and they will be discussed below). With class promotion, the source symbol "fran" is moved to the top position or block in the next highest class in the class hierarchy of data structure 200; in this case, cross referencing FIGS. 2 and 4, "fran" is moved from block 215 to block 212, that is, from class $C_3$ to the top of class $C_2$. In making this change, "fran" now has an associated recency rank of "2". This change has further ramifications. First, the "up" and "down" pointers stored in location 129 must be changed to reflect the new position of "fran" in the class hierarchy. Secondly, the bottom-most symbol in class $C_2$, namely, "ed", is moved to the top of the next lowest class $C_3$. Accordingly, "ed" now occupies block 214 in conceptual data structure 200 so the "up" and "down" pointers for "ed" must be changed as well as its recency rank. Next, the symbols in class $C_2$ below the top-most symbol, which is now "fran", must be "pushed-down" to the next correspondingly lower blocks in data structure 200. For the example, "beth" is moved from block 212 to block 213. This implies a change in the recency rank (from 2 to 3) associated with "beth", as well as a change in the "up" and "down" pointers for "beth." Finally, the symbols in class $C_3$ below the top-most symbol, which is now "ed", must be "pushed-down" to the next correspondingly lower blocks in data structure 200. For instance, "carl" is moved from block 214 to block 215, thereby altering its recency rank (4 to 5) and its "up" and "down" pointers.

Figure 5:
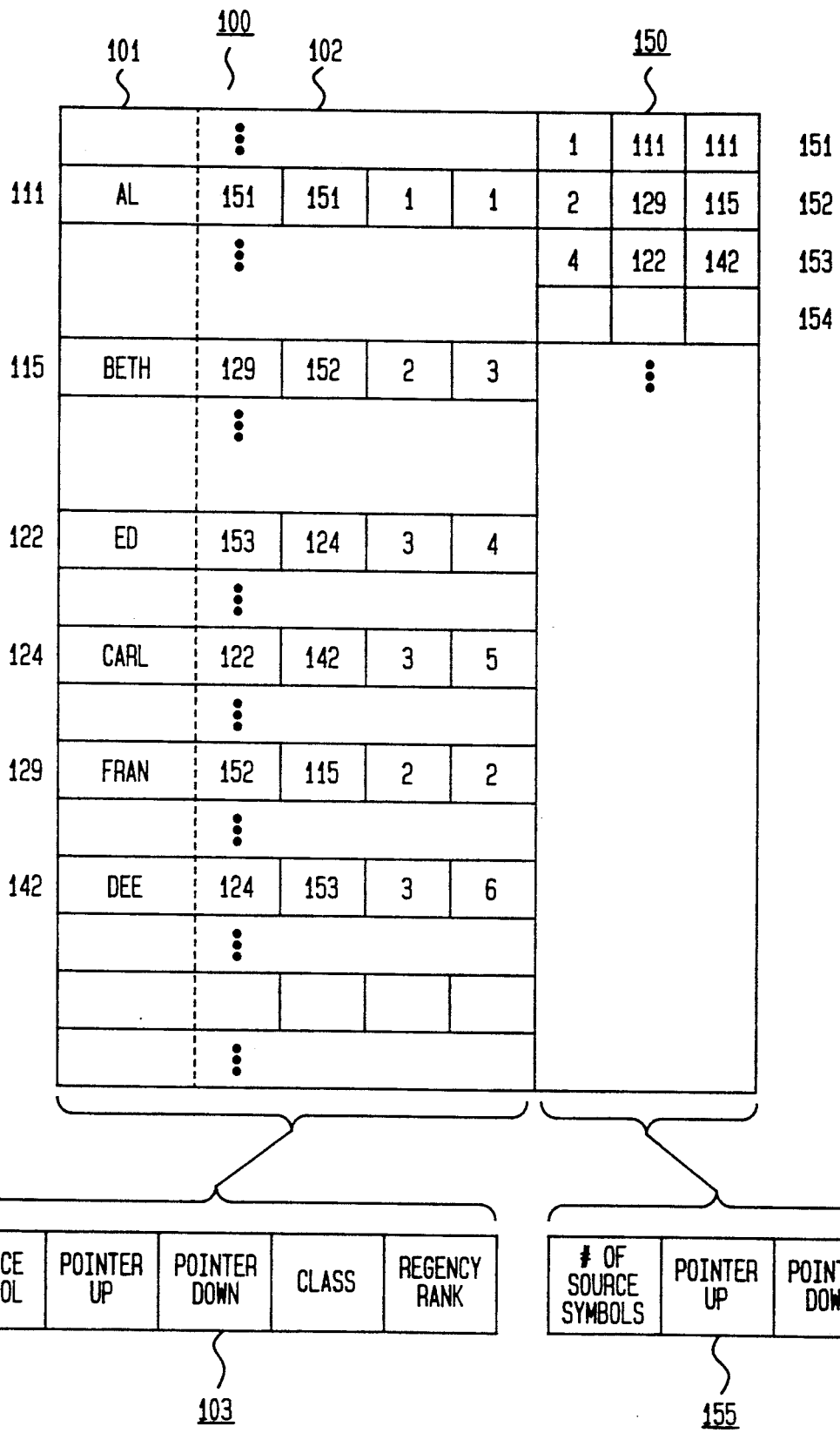
FIG. 5 is a depiction of another memory layout which is representative of a multiple-doubly-linked (MDL) list showing exemplary storage locations for storing the illustrative members and class information upon processing of a next source symbol.

The state of memory segments 100 and 150 after the Update operation is completed is illustrated by FIG. 5. It should be especially noted that all symbols continue to occupy their same memory locations; only the information stored at the locations changes. For instance, location 129 still stores "fran", but the following have changed: recency rank (5 to 2); the class (3 to 2); "up" pointer ('124' to '152'); and "down" pointer ('142' to '115').

Figure 6:
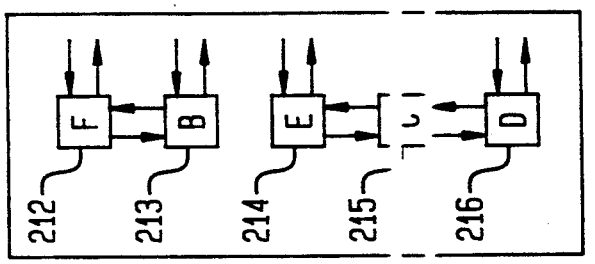
FIGS. 6–10 depict the sequence of pointer additions and deletions to Update the MDL using class promotion to convert the information content of FIGS. 2 and 3 to FIGS. 4 and 5, respectively.
Figure 7:
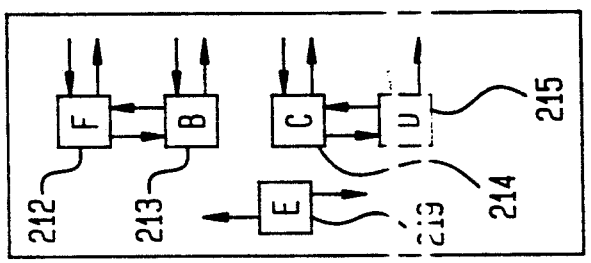
Figure 8:
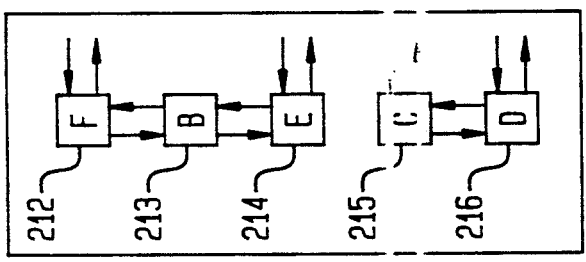
Figure 9:
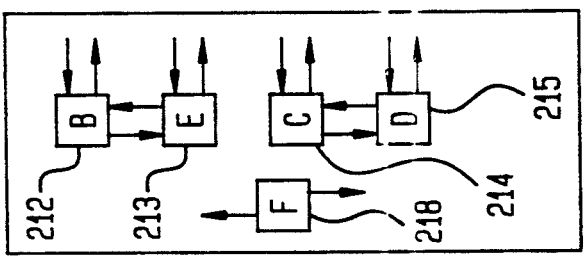
Figure 10:
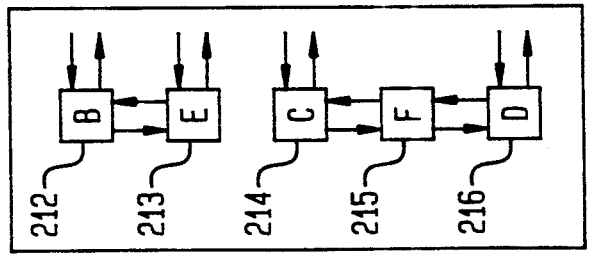

The sequence of depictions for data structure 200 in FIGS. 6-10 shows the rearrangement of blocks 212-216 in classes $C_2$ and $C_3$ as a single Update step unfolds. In FIG. 6, original data structure 200 of FIG. 2 is shown (for convenience, each symbol has been shortened to a single capital letter indicative of the first lower case letter of the symbol; for instance, F for "fran", B for "beth"). In FIG. 7, the "up" and "down" pointers for F are shown as detached, and F is associated with a "floating" block 218, that is, "fran" is first removed from the class hierarchy by connecting the "down" pointer of "carl" and the "up" pointer of "dee" to reference each other. In FIG. 8, F is inserted at the top of class $C_2$ by appropriately modifying the "up" and "down" pointers associated with F, B, and class $C_2$. In FIG. 9, E is removed from class $C_2$ by detaching its "up" and "down" pointers, by associating E with "floating" block 219, and by having associating the "up" pointer of B with class $C_2$ and the "down" pointer of class $C_2$ with B. Finally, in FIG. 10, E is inserted at the top of class $C_3$ by appropriately modifying the "up" and "down" pointers associated with E, C, and class $C_3$. The depictions in FIGS. 6 and 10 are the "before" and "after" contents, respectively, of blocks 212-216 of data structure 200; the depictions of FIGS. 7-9 are transitory and provide insight into the ephemeral rearranging of links in the multiple-doubly linked (MDL) list corresponding to the symbol dictionary.

Figure 11:
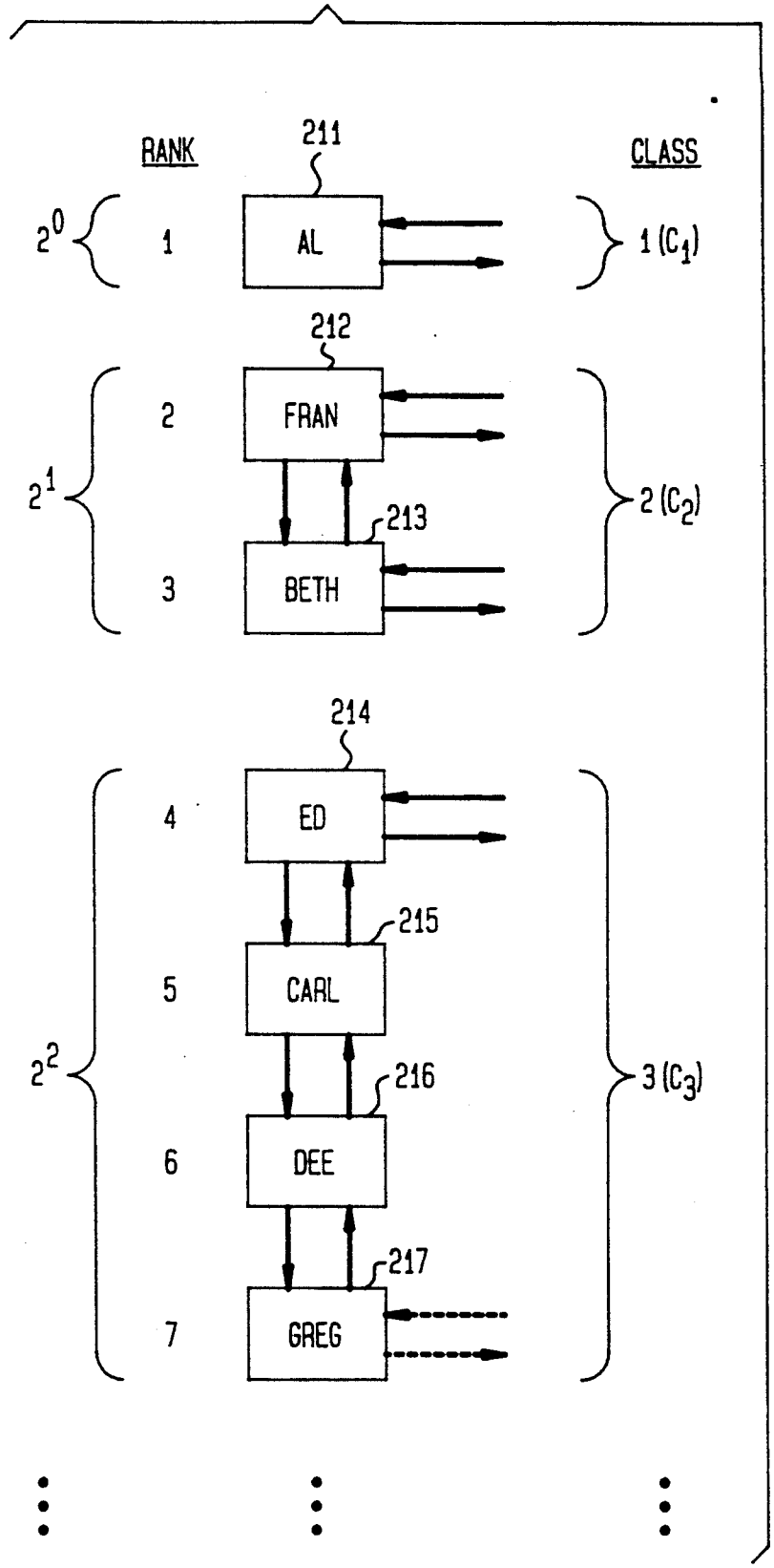

As another example to illustrate the interplay between data structure 200 and the contents of memory segments 100 and 150, reference is now made to FIGS. 11 and 12. It is assumed that the initial state of data structure 200 and memory 100 and 150 are as represented by FIGS. 4 and 5, respectively. Now a new next symbol, denoted "greg", is introduced for processing. As a result of the Search step, it is determined by an associative memory search that this symbol is not contained in memory 100. Accordingly, to effect propagation of the symbol "greg" over the medium, a series of bit streams are emitted from the transmitter, namely: a predetermined delimiter; a bit pattern indicative of the number of characters (four) in the new symbol; and the extended ASCII representation of "greg"a Since, "greg" is a new symbol, a blank memory location is allocated to store information about "greg"; referring to FIG. 12, location 147 is so chosen.

Regarding the Update step, with reference to FIG. 11, one option is to place "greg" into block 217 at the bottom of data structure 200; block 217 is in class $C_3$ and has recency rank 7. This requires a change in the following pointers: the "down" pointers of "dee" and class $C_3$ now point to memory location 147 which stores information about "greg". The "up" and "down" pointers of "greg" store memory locations 142 and 153, respectively, which relate to "dee" and class $C_3$.

Although each of the memory locations of memory segment 100, such as location 111 in FIG. 3, has been shown conceptually as composed of five contiguous pieces of information (source symbol, "up" and "down" pointers, class member, and recency rank), it is not necessary that such information be stored contiguously. In FIG. 3, memory segment 100 is shown as being divided into two sub-segments 101 and 102. Sub-segment 101 stores the source symbol associated with the given location, such as "al" for location 111, whereas sub-segment 102 stores the remaining four pieces of information (pointers, class, rank). In fact, it is often most effective to actually implement these two sub-segments with different physical elements. Thus, sub-segment 101 may be realized in hardware, for example, with a content addressable memory (CAM), whereas sub-segment 102 is physically a conventional memory. (As an example of a commercially available CAM element, reference is made to device Am99C10 produced by Advanced Micro Devices, Inc. This device has a capacity of 256 words by 48 bits each; a plurality of devices may be arranged to form a larger CAM component). In this embodiment, CAM 101 stores the $i^{th}$ source symbol at location i in CAM 101, and main memory 102 stores the four pieces of information at its corresponding $i^{th}$ address. Accordingly, CAM 101 and main memory 102 are in one-to-one correspondence.

Given the aforementioned realization of CAM 101 and main memory 102, the Search and Update technique may be reiterated as follows. Upon the arrival of the next source symbol, determine if this source symbol is in CAM 101:

Case I (a) if the source symbol is found, its location i in main memory 102 is extracted from CAM 101;

(b) the recency rank at location i in main memory 102 is propagated as a bit stream over the transmission medium; and (c) the class promotion procedure is used to rearrange pointer, class, and rank information in main memory 102. Thus, in this case, only the contents of main memory 102 are altered.

Case II (a) if the source symbol is not found, then the following are propagated in series: the delimiter bit pattern, the character count bit stream, and the ASCII bit stream;

(b) the new source symbol is entered into a new location j in CAM 101;

(c) this new location j is transmitted to main memory 102;

(d) the class promotion procedure is used to arrange pointer, class, and rank information in main memory 102;

(e) if a new location in not available in CAM 101, then CAM 101 effects an overwrite at a random location.

Function Theoretic Basis

This section contains the generalization to the methodology explained above in terms of the simplified illustrative example. The technique referred to as class promotion method is covered initially. Then a variation is presented which requires a slight increase in main memory size. In each case, it takes a small, constant number of steps to process each source symbol.

Data Structure (with reference to, for example, FIGS. 2 and 3): The source symbol entries of the dictionary or codebook are stored in an associative memory—a content addressable memory (CAM) in a hardware realization or a hashing table in a software implementation. The associative memory has the function that, when it is presented with a source symbol $X_t$, it returns the position of the symbol in the associative memory, denoted $pos(X_t)$, in a unit of processing time. If $X_t$ is not in the memory, $pos(X_t)$ will return a signal indicating the symbol is not present.

In addition, there is a multiple-doubly-linked (MDL) list from the top to the bottom corresponding to the classes. More specifically, each main memory entry corresponding to the MDL list is composed of four fields: (1) "up" pointer to the position of the classmate (block in data structure or class itself) immediately above it; (2) "down" pointer to the position of the classmate immediately below it; (3) the class number containing the symbol; and (4) the binary codeword string r (having $L+2\lfloor \log_2 L \rfloor$ bits), where L is the numerical designation of the class, i.e., $L=1,2,3,\ldots$; if the recency rank is r, then the Elias integer representation for r is $1+\lfloor \log_2 r \rfloor + 2\lfloor \log_2(1+\log_2 r) \rfloor$.

In another region of main memory, there are $1+\lfloor \log_2 M \rfloor$ class information entries, one for each class, where M is the maximum size, in decimal, of the codebook. Each entry has three fields: (1) number of codewords in the class, (2) "up" pointer to the position of the top codeword of the class, and (3) "down" pointer to the position of the bottom codeword of the class. The second field of the top of a class points to the position of its class information entry, and the third field of the bottom member of a class points to the position of its class information entry.

Symbol Search: Given input symbol $X_t$, find its position in the codebook, i.e. CAM. This is very fast for an associative memory. It is done by the associative memory function $i = pos(X_t)$. Then the fourth field of position i in main memory, i.e., the binary codeword string of the recency rank, is emitted. If $X_t$ is not in the memory, $pos(X_t)$ will return a special signal indicating so. In this case, a special "new word" delimiter is outputted, then a word indicative of the size of the symbol $X_t$, followed by the entire symbol $X_t$.

Codebook Update: If $X_t$ is in class $C_i$, then it is promoted to the top of class $C_i-1$; and the bottom of class $C_i-1$ is demoted to the top of class $C_i$ (another variation includes putting the top member of class $C_{i-1}$ to the newly vacated position of the promoted symbol). This involved four insertions/deletions in the MDL list. First $X_t$ is deleted from class $C_i$. Second, $X_t$ is inserted to the top of class $C_{i-1}$. Third, the bottom member of class $C_{i-1}$, say Y, is deleted. Fourth, Y is inserted to the top of class $C_i$. FIGS. 6-10 illustrated a sequence of such events with $X_t = F$.

The complete search and update operations per input symbol are summarized below, in pseudo-language; it is assumed that the dictionary is already full and that $X_t$ is in the dictionary (note: "i.s." is the value of the $s^{th}$ field of entry at position i).

i=pos($X_t$);
output i.4;
delete (i);
C=i.5;
insert (i, C−1);
itmp=(C−1).2
delete (itmp);
insert=(itmp, C);
tmp=i.4;
i.4=itmp.4;
itmp.4=i.4. /*End*/

The function "delete(i)" in this pseudo-language deletes dictionary entry at position i from its class list. The function "insert(i,C)" inserts the dictionary at position i to the front of class C. These functions are specified below:

```
/* delete(i) */
    j = i.2;
    k = i.3;
    j.3 = k;
    k.2 = j. /* End */
/* insert(i,C) */
    j = C.1;
    C.1 = i;
    i.2 = C;
    i.3 = j;
    j.2 = i. /* End */
```

A software hashing table can be used instead of a CAM. In this approach, presented in detail below, the average search time is a small constant. But the unlikely event of a long search time due to excessive collisions has a non-zero probability. If bounded search time is required, there is a method to accomplish it: If $X_t$ is to be stored into the hashing table and a collision occurs with an existing symbol, say Y, then Y is merely discarded from the codebook and $X_t$ is inserted in its place, i.e. $X_t$ inherits Y's position and codeword string. This way, the symbol search time is exactly one time unit. The loss of compression efficiency from dropping Y prematurely is negligible for reasonable hashing table size.

The hashing technique can be specified in terms of a conventional hashing function f which maps contents into addresses in as random a fashion as possible. When writing a word (or content) w into the memory, the program calculates f(w) and then writes w into location f(w) of the memory. When reading a word w the program calculates f(w) and verifies whether location f(w) in the memory contains w; if so, then the program outputs f(w).

One potential problem with a software associative memory is hashing collision. This results from two words having the same hashing value, i.e. $f(w_1)=f(w_2)$. In this case, there are a number of difficulties: Say $w_1$ is already written in the memory at location $f(w_1)$ naturally, and now it is desired to write $w_2$ into the same location. This is called a hashing collision. There are many schemes to resolve such mishaps. Each solution to resolve write collisions also affects the read operation. One useful approach is called "closing addressing without collision resolution". In this approach, any complication of collision resolution is alleviated.

To eliminate hash-collision complications, the approach is as follows: whenever there is an incident $f(w_1)=f(w_2)$ and a write collision occurs, the late comer is simply written into the location, overwriting the existing occupant. So at reading, only one probe (test whether a location contains the word at hand) is required. This resolution is particularly suitable for this data compression application. In conjunction with data compression, it is necessary to write into associative memory only when a new word is to be added to the dictionary. In this case, the entry at the end (usually the least-recently-used word) is to be discarded when the codebook is full. All the "closed addressing" resolution does is to discard the entry which is overwritten by the new word. A random unlucky entry is discarded which may not be the least-recently-used. This may degrade the compression performance, but the effect is minor.

The focus above has been on the class promotion technique, and it has been alluded to that other variations are possible. The so-called Move Half-way to Front scheme can be implemented similarly. The same data structure can be used except there is an additional pointer for each main memory entry. Consider an entry in class $C_i$ with overall recency rank r. Its pointer stores the position of the entry with overall ranking r/2 (which is in class $C_i-1$). Symbol search can be done in the same way as in class promotion. Updating is done by (1) delete $X_t$ from list for class $C_i$; (2) insert $X_t$ to $C_i-1$: (3) delete bottom of list $C_i-1$, call it Y; and (4) insert Y to front of list of $C_i$. The new pointer gives the position in $C_{i-1}$ where $X_t$ should be inserted. The total computation time remains the same as in class promotion. The only extra cost is in the increased memory size to accommodate the additional pointer per memory entry.

Illustrative Circuit Embodiment

Figure 13:
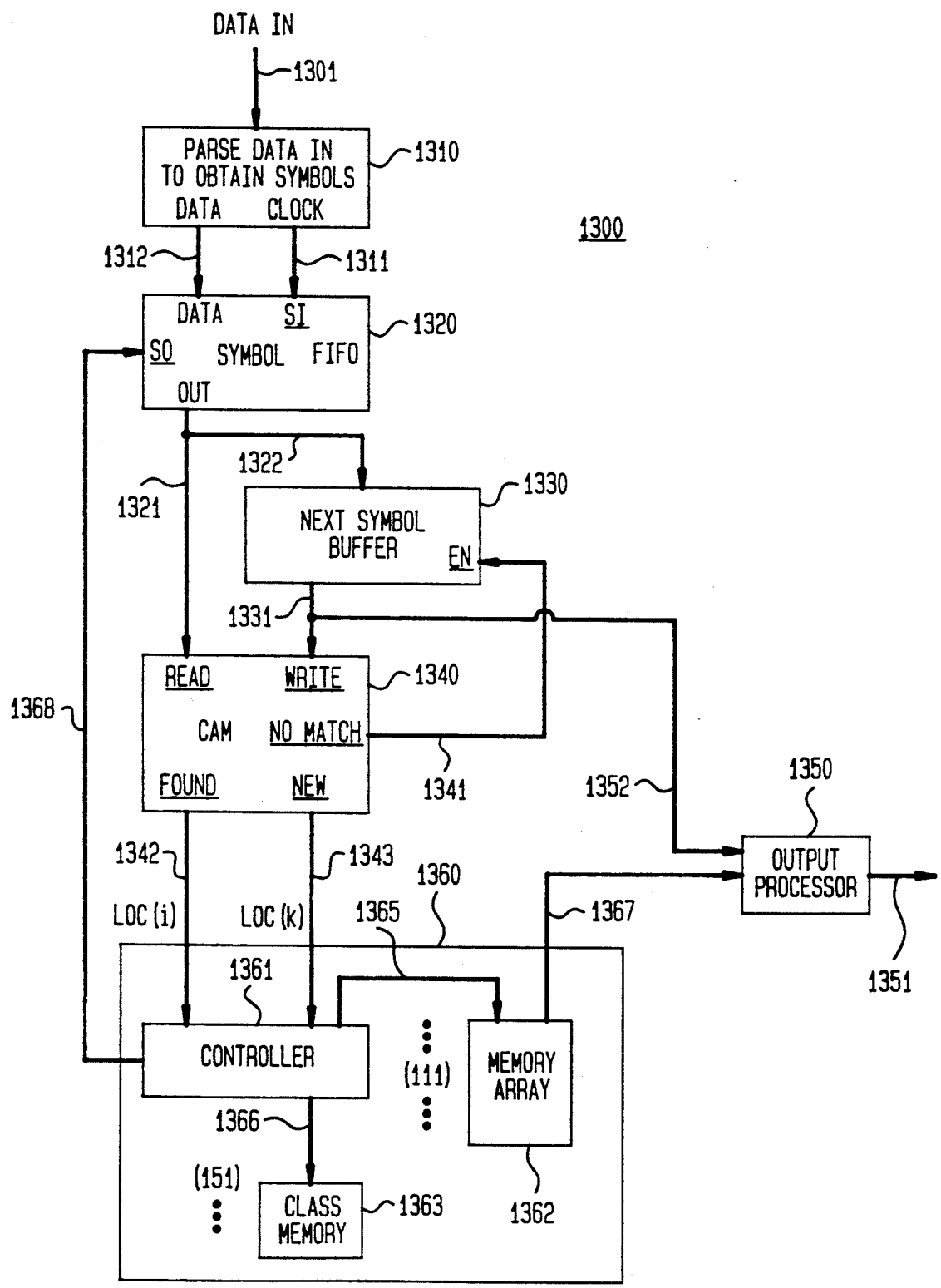
FIG. 13 is a block diagram of an illustrative encoder in accordance with the present invention.

Encoder 1300 of FIG. 13 in accordance with the present invention includes input parser 1310 which receives the DATA IN delivered on lead 1301. Parser 1310 serves to partition the incoming data stream on lead 1301 into source symbols using any standard lexical analysis technique and to generate timing. The source symbols are then transmitted, via lead 1312 under control of the clock on lead 1311, to symbol FIFO 1320 at the shift-in (SI) port of FIFO 1320. Thus, incoming symbols are arranged contiguously on a first-n, first-out basis. The shift-out (SO) signal received on lead 1368 from controller 1361 causes the next available symbol to be delivered to both CAM 1340 and buffer 1330, over leads 1321 and 1322, respectively. Buffer 1330 stores this "next symbol" during the next processing phase. CAM 1340 receives this "next symbol" at its input READ port. If the "next symbol" is located in CAM 1340, the location of the symbol, say location i [(denoted loc(i)], is emitted on lead 1342, which serves as an input to memory 1360, and more particularly, controller 1361 of memory 1360. Since this "next symbol" was located in CAM 1340, there is a corresponding location in memory array 1365, a subcomponent of memory 1360, which includes information on the "up" and "down" pointers, the class, and the recency rank (as explained, for example, with reference to labels 102 and 103 of FIG. 3). Controller 1361 causes memory 1362 to deliver the recency rank to output processor 1350 via lead 1367. Output processor 1350 performs any required rate-increasing functions and data smoothing of the data arriving on either of its input leads, namely, leads 1367 and 1352. The stream of data to be propagated from encoder 1300 is emitted via lead 1351 from processor 1350. Once the recency rank has been sent to output processor 1350, the updating operations commence under control of controller 1361. Such operations include promoting the symbol to the appropriate class, demoting other symbols, and changing the associated pointers in the MDL, and storing such changes in main memory 1362 and class memory 1363. When the updating operations are completed, a shift-out signal is transmitted to FIFO 1320 to process another symbol in the queue.

The above description presumed that the "next symbol" delivered on leads 1321 and 1322 could be located in CAM 1340. In the situation in which this "next symbol" is not resident in CAM 1340, then a NO MATCH signal is emitted on lead 1341 from CAM 1340. CAM 1340 keeps track of available locations into which new symbols may be entered; this next available location is designated loc(k). The signal on lead 1341 enables buffer 1330 to pass the "next symbol" to the WRITE port of CAM 1340. This new "next symbol" is written into loc(k), and loc(k) is delivered to controller 1361 for update processing. Concurrently, the signal on lead 1341 enables buffer 1330 so as to deliver, via lead 1331, the "next symbol" to output process 1350 wherein the required bit stream is formed, including the delimiter, the size of symbol, and the extended ASCII representation of the "next symbol".

Figure 14:
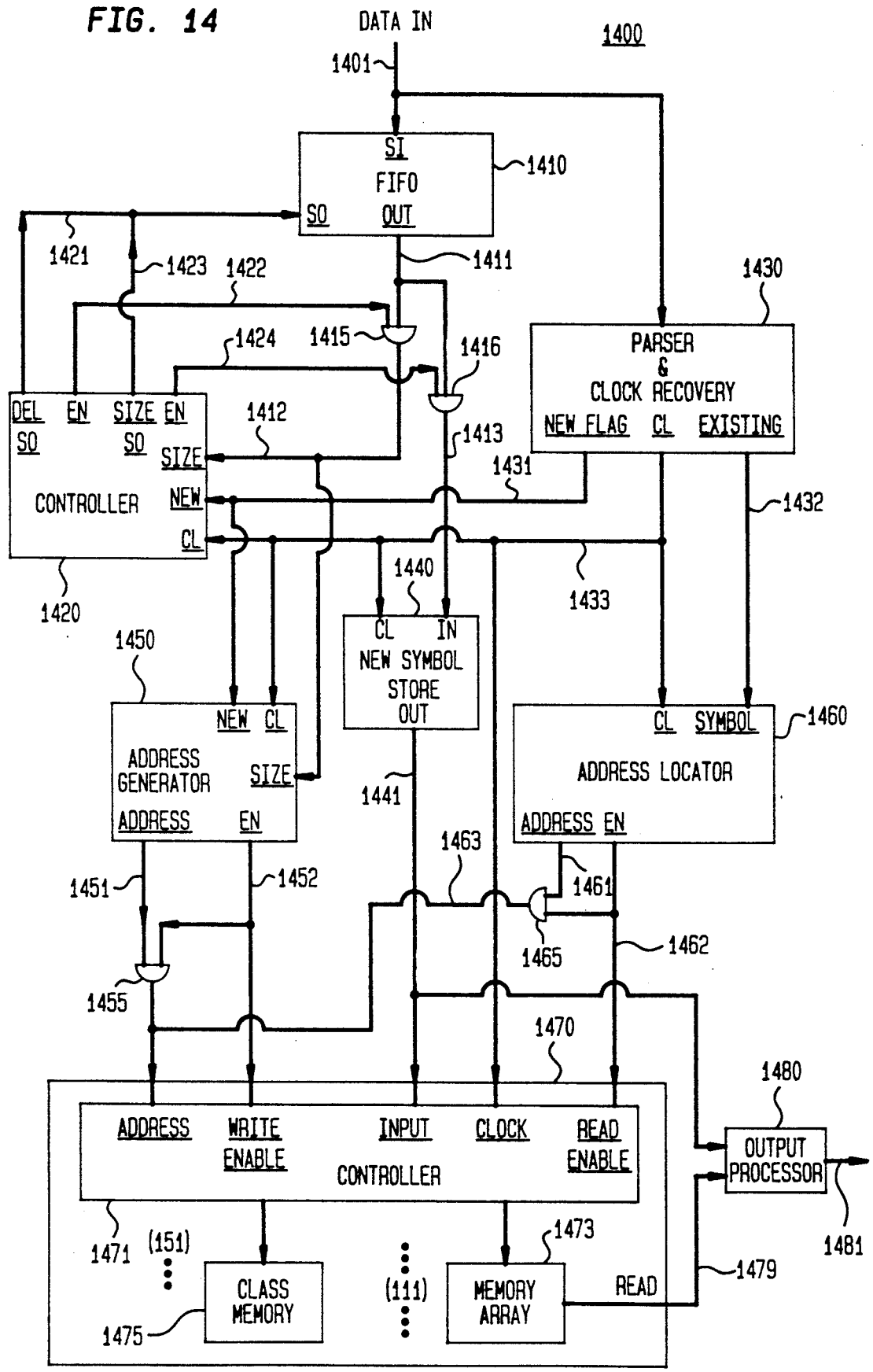
FIG. 14 is a block diagram of an illustrative decoder in accordance with the present invention.

Decoder 1400 of FIG. 14 in accordance with the present invention includes both FIFO 1410 and parser 1430 which receive the DATA IN delivered on lead 1401 from, for example, a transmission medium or a storage device. FIFO 1410 serves as a buffer to store data arriving at a given rate during intermediate processing which classifies segments of the incoming data into "new" symbol or "existing" symbol categories. Parser 1430 operates on the incoming data to recover a clock for timing decoder 1400 as well as to separate out "new" symbols from "existing" symbols on a sequential basis. Since a "new" symbol is characterized by a grouping of three bit strings, namely, delimiter string, new symbol size string, and new symbol string, parser 1430 is arranged to detect each delimiter string. Presuming a delimiter string is normally the initial data transmitted in an incoming data stream, parser 1430 detects this delimiter string and sends a "new" symbol signal from its corresponding NEW FLAG port to NEW port of controller 1420 via lead 1431; controller 1420 also receives the clock signal at its CL port from parser 1430 via lead 1433. Controller 1420, in response to the "new" symbol flag, activates FIFO 1410, via lead 1421 connected from the DEL SO port to the SO port of FIFO 1410, to shift-out bit positions containing the size of the new symbol size string. The bits are emitted from the OUT port of FIFO 1410 on lead 1411, which serves as one input to AND gate 1415; the other input to gate 1415 is the enable signal (EN) from controller 1420 on lead 1422. The bits containing the new symbol size are delivered during activation of gate 1415 to the SIZE port of controller 1410. Once the size of the new symbol is known, then controller 1420 converts this information into another shift-out signal delivered to FIFO 1410 now via lead 1423. At the same time, a corresponding enable signal on lead 1424 is delivered to one input of AND gate 1416, so that bits transmitted on lead 1411 from FIFO 1410 can be delivered to new symbol store 1440 through gate 1416 and its corresponding output lead 1413.

The signals on leads 1413, 1412, and 1433, namely, the "new" symbol flag, the size of the new symbol, and the clock all serve as inputs to address generator 1450. Generator 1450 serves the same function as CAM 1340 in encoder 1300. In particular, controller 1450 generates the address to be used by main memory processor 1470 for storing the new symbol residing in new symbol store 1440. The address generated is identical to the one into which the new symbol was written in main memory 1360 in encoder 1300. For example, if encoder 1300 is implemented in hardware (as distinguished from software) so CAM 1340 is a hardware device, then the address generated is the physical address into which the new symbol was written in memory 1360. In fact, one realization of address generator 1450 is the same device used for CAM 1340. Once a determination is made that new symbol store 1440 has stored all the bits of the new symbol, AND gate 1455 is enabled by address generator 1450, via lead 1452, to deliver address information emitted on lead 1451 to the ADDRESS port of main memory processor 1470; this address information allows the new symbol appearing on lead 1441 the INPUT port of memory processor 1470 to be written into memory. The inputting of the new symbol causes controller 1471, a subcomponent of memory processor 1470, to update the required information about "up" and "down" pointers, class membership, and recency rank in a manner commensurate with encoder 1300, that is, decoder 1400 is arranged to replicate the operations performed by encoder 1300 by main memory 1360. Concurrent with the update operations, the new symbol is also propagated to output processor 1480 from new symbol store via lead 1441. Output processor 1480 formats the bit string representative of the new symbol by effecting rate-changing and data smoothing when necessary.

Returning now to the point of parsing incoming data, it is now supposed that an "existing" symbol has been detected in the data string. This string is recognized as the Elias integer representation. The "existing" symbol is sent to address locator 1460, which in turn locates the address of this "existing" symbol in substantially the same manner as address generator 1450. The address information is sent from generator 1460 to AND gate 1465 along with an enable signal appearing on lead 1462; this enable signal also connects to the READ ENABLE port of main processor 1470. The enable signal activates AND gate 1465 so as to pass the address information, via lead 1463, to the ADDRESS port of memory processor 1470. The "existing" symbol, which is stored in memory array 1473, is emitted from the READ port of memory processor 1470 and delivered to output processor 1480 via lead 1479. Once emitted, the usual update operations on class memory 1475 and memory array 1473 are performed according to the implemented update procedure (e.g., class promotion).

It is to be understood that the above-described embodiment is simply illustrative of the principles in accordance with the present invention. Other embodiments may be readily devised by those skilled in the art which may embody the principles in spirit and scope. Thus, it is to be further understood that the circuit arrangements described herein are not limited to the specific forms shown by way of illustration, but may assume other embodiments limited only by the scope of the appended claims.

What is claimed is:

1. A method for compressing an incoming data stream to produce an outgoing compacted data stream, the method utilizing: an associative memory; and a main memory for storing at each location a multiple-doubly-linked list including pointer information, class membership information, and recency rank information, and for storing at an associated location class pointer information, all information arranged according to a class promotion data structure, the method comprising the steps of (a) parsing the incoming data stream to generate a corresponding stream of symbols,
    (b) sequentially processing each symbol from said stream of symbols to determine if said each symbol is stored in the associative memory and the main memory and, if so, continuing with step (c); otherwise, invoking step (f),
    (c) determining a storage location of said each symbol in the main memory from the associative memory,
    (d) extracting the recency rank information from said storage location and propagating the recency rank information as a bit stream in the outgoing compacted data stream, (e) updating the pointer, class membership, class pointer, and recency rank information in the main memory using the class promotion data structure, and returning to step (b), (f) propagating in the outgoing compacted data stream a predetermined delimiter bit pattern, the length of said each symbol, and a bit stream representative of said each symbol, (g) entering said each symbol into the associative memory at an available location, (h) providing said available location to the main memory, (i) entering the pointer, class membership, class pointer, and recency rank information corresponding to said each symbol into the main memory corresponding to said available location, and returning to step (b).

2. A method for compacting an incoming data stream to generate a compacted outgoing data stream comprising the steps of parsing the incoming data stream to partition the incoming stream into a sequence of source symbols, and for each of the source symbols, determining if said each source symbol is stored in a memory having recency rank, class information and pointer information in correspondence to a class promotion data structure, if said each symbol is located in the memory, transmitting the recency rank associated with said each symbol as a segment of the compacted data stream corresponding to said each symbol, and updating the recency rank, class information and pointer information in the memory in accordance with the class promotion data structure, if said each symbol is not located in the memory, transmitting as a segment of the compacted data stream corresponding to said each symbol a data block including a predetermined delimiter, the length of said each symbol, and a preselected representation for said each symbol, storing said each symbol in an available location in the memory, and updating the recency rank, class information and pointer information in the memory in accordance with the class promotion data structure.

3. The method as recited in claim 2 wherein said first step of updating includes the steps of promoting said each symbol to a higher class to produce a promoted symbol, demoting the symbol previously occupying the location of said promoted symbol to a lower class to produce a demoted signal, and rearranging pointer information associated with said promoted signal and said demoted symbol.

4. The method as recited in claim 3 wherein the step of promoting said each symbol to a higher class includes the step of moving said promoted symbol to the topmost position in the next highest class.

5. The method as recited in claim 4 wherein said step of demoting the symbol previously occupying the location of said promoted symbol includes the step of pushing down in the class structure all of said symbols occupying class positions between the top-most position and the position previously occupied by said promoted symbol.

6. The method as recited in claim 3 wherein the step of promoting said each symbol to a higher class includes the step of moving said promoted symbol half-way to the top of the class structure.

7. The method as recited in claim 6 wherein said step of demoting the symbol previously occupying the location of said promoted symbol includes the step of moving said demoted symbol to the location previously occupied by the promoted symbol.

8. The method as recited in claim 3 wherein said second step of updating includes the step of rearranging the associated pointers associated with said available location.

9. A method for compressing an incoming data stream to produce an outgoing compacted data stream, the method utilizing: an associative memory; and a main memory for storing at each location a multiple-doubly-linked list including pointer information, class membership information, and recency rank information, and for storing at an associated location class pointer information, all information arranged according to a move half-way to front data structure, the method comprising the steps of (a) parsing the incoming data stream to generate a corresponding stream of symbols, (b) sequentially processing each symbol from said stream of symbols to determine if said each symbol is stored in the main memory and, if so, continuing with step (c); otherwise, invoking step (f), (c) determining a storage location of said each symbol in the main memory from the associative memory, (d) extracting the recency rank information from said storage location and propagating the recency rank information as a bit stream in the outgoing compacted data stream, (e) updating the pointer, class membership, class pointer, and recency rank information in the main memory using the move half-way to front data structure, and returning to step (b), (f) propagating in the outgoing compacted data stream a predetermined delimiter bit pattern, the length of said each symbol, and a bit stream representative of said each symbol, (g) entering said each symbol into the associative memory at an available location, (h) providing said available location to the main memory, (i) entering the pointer, class membership, class pointer, and recency rank information corresponding to said each symbol into the main memory corresponding to said available location, and returning to step (b).

10. Circuitry for compressing an incoming data stream to produce an outgoing compacted data stream comprising, an associative memory a main memory for storing at each location a multiple-doubly-linked list including pointer information, class membership information, and recency rank information, and for storing at an associated location class pointer information, all information arranged according to a class promotion data structure, means for parsing the incoming data stream to generate a corresponding stream of symbols, means for sequentially processing each symbol from said stream of symbols to determine if said each symbol is stored in the main memory, means for determining a storage location of said each symbol in the main memory from the associative memory whenever each said symbol is stored in the main memory, for extracting the recency rank information from said storage location and propagating the recency rank information as a bit stream in the outgoing compacted data stream, and for updating the pointer, class membership, class pointer, and recency rank information in the main memory using the class promotion data structure, and for reinvoking said means for processing, and means for propagating in the outgoing compacted data stream a predetermined delimiter bit pattern, the length of said each symbol, and a bit stream representative of said each symbol whenever said each symbol is not stored in main memory, for entering said each symbol into the associative memory at an available location, for providing said available location to the main memory, for entering the pointer, class membership, class pointer, and recency rank information corresponding to said each symbol into the main memory corresponding to said available location, and for reinvoking said means for processing.

11. A method utilizing a memory for decoding a compacted data stream into an output data stream, the compacted data stream formed by compressing an incoming data stream partitioned into a sequence of symbols using a class promotion data structure to encode the compacted data stream, the compacted data stream having a predetermined delimiter to distinguish each new symbol from each repeated symbol, and a preselected number of data locations following the delimiter allocated to the length of the each new symbol, the memory storing at each storage location for each repeated symbol information including the symbol, recency rank information, class information, and pointer information, the method comprising steps of (a) sequentially parsing the compacted data stream to determine whether the next incoming one of said symbols is a new symbol or a repeated symbol, and if said next symbol is a new symbol, proceeding to step (c); otherwise continuing with step (b), (b) determining the storage location of said repeated symbol based on said recency rank, delivering the symbol from the memory to the output data stream, updating the memory using the class promotion data structure, and returning to step (a), and and returning to step (a), and (c) determining the length of said new symbol from the predetermined number of data locations following the delimiter, gating data from the compacted data stream to the output data stream based on the length of said new symbol, updating the memory using the class promotion data structure, and returning to step (a).

12. Circuitry for decoding a compacted data stream into an output data stream, the compacted data stream formed by utilizing a memory to compress an incoming data stream partitioned into a sequence of symbols using a class promotion data structure to encode the compacted data stream, the compacted data stream having a predetermined delimiter to distinguish each new symbol from each repeated symbol, and a preselected number of data locations following the delimiter allocated to the length of the each new symbol, the memory storing at each storage location for each repeated symbol information including the symbol, recency rank information, class information, and pointer information, the circuitry comprising means for sequentially parsing the compacted data stream to determine whether the next incoming one of said symbols is a new symbol or a repeated symbol, means for determining the storage location of said repeated symbol based on said recency rank whenever said next symbol is a repeated symbol, for delivering the symbol from the memory to the output data stream, for updating the memory using the class promotion data structure, and for reinvoking said means for sequentially parsing, and means for determining the length of said new symbol from the predetermined number of data locations following the delimiter when said next symbol is a new symbol, for gating data from the compacted data stream to the output data stream based on the length of said new symbol, for updating the memory using the class promotion data structure, and for reinvoking said means for parsing.

* * * * *